United States Patent
Hill

(10) Patent No.: US 7,875,546 B1
(45) Date of Patent: Jan. 25, 2011

(54) SYSTEM AND METHOD FOR PREVENTING METAL CORROSION ON BOND PADS

(75) Inventor: Rodney Hill, Mansfield, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 782 days.

(21) Appl. No.: 11/514,621

(22) Filed: Sep. 1, 2006

(51) Int. Cl.
*H01L 21/44* (2006.01)
(52) U.S. Cl. .............................. 438/612; 257/E21.506
(58) Field of Classification Search .................. 438/612
See application file for complete search history.

(56) References Cited

U.S. PATENT DOCUMENTS

| | | | |
|---|---|---|---|
| 5,444,012 A | | 8/1995 | Yoshizumi et al. |
| 5,563,762 A | | 10/1996 | Leung et al. |
| 5,798,568 A | | 8/1998 | Abercrombie et al. |
| 5,814,563 A | | 9/1998 | Ding et al. |
| 5,930,664 A | * | 7/1999 | Hsu et al. ................... 438/612 |
| 6,006,764 A | * | 12/1999 | Chu et al. ...................... 134/1.2 |
| 6,177,355 B1 | * | 1/2001 | Shields et al. ............... 438/714 |
| 6,221,752 B1 | * | 4/2001 | Chou et al. .................. 438/612 |
| 6,376,353 B1 | * | 4/2002 | Zhou et al. .................. 438/612 |
| 6,593,222 B2 | * | 7/2003 | Smoak ........................ 438/615 |
| 6,677,226 B1 | | 1/2004 | Bowen et al. |
| 6,750,129 B2 | | 6/2004 | Yang et al. |
| 6,866,943 B2 | | 3/2005 | Friese et al. |
| 6,924,172 B2 | * | 8/2005 | Roche et al. ................. 438/106 |
| 2005/0116357 A1 | * | 6/2005 | Fitzsimmons et al. ....... 257/787 |
| 2007/0238304 A1 | | 10/2007 | Wu |

OTHER PUBLICATIONS

Thomas J. Barbieri et al., "Vanishing TiN ARC Coating as an Indicator of EOS in Aluminum Top Metal Lines", Proceedings of the 32nd International Symposium for Testing and Failure Analysis, Nov. 12-16, 2006, pp. 461-468.

* cited by examiner

*Primary Examiner*—Zandra Smith
*Assistant Examiner*—Grant S Withers

(57) ABSTRACT

A system and method are disclosed for preventing metal corrosion on bond pads. During manufacture of an integrated circuit device an anti-reflective coating (ARC) layer is applied to a metal stack of a bond pad. A mask and etch process is applied to etch an aperture through the ARC layer down to the metal stack. Then a passivation layer is applied to cover the ARC layer and the aperture through the ARC layer. Then another mask and etch process is applied to etch a bond pad opening through the passivation layer inside the ARC layer aperture down to the metal stack. Interior edge portions of the passivation layer seal the interior edge portions of the ARC layer aperture to prevent corrosion of the ARC layer due to high temperatures, high humidity and corrosive materials encountered in subsequent assembly operations of the integrated circuit device.

20 Claims, 4 Drawing Sheets

SYSTEM AND METHOD FOR PREVENTING METAL CORROSION ON BOND PADS

TECHNICAL FIELD OF THE INVENTION

The present invention is generally directed to the manufacture of integrated circuits and, in particular, to a system and method for preventing corrosion on bond pads.

BACKGROUND OF THE INVENTION

In the manufacture of an integrated circuit device bond pads are created on the device to receive circuit connectors that provide external electrical connection to the metal layers of the integrated circuit device. The methods that are used in the prior art to create a bond pad opening in the device typically etch through the various layers of the integrated circuit device. The uppermost layer is usually a passivation layer. Under the passivation layer is an anti-reflective coating layer (sometimes referred to as an ARC layer) that comprises the top layer of a metal stack. The remainder of the metal stack is located under the ARC layer. The metal stack is typically located on an underlying oxide layer.

Prior art methods mask and etch a bond pad opening through the passivation layer and through the ARC layer down to the metal stack. This method leaves the interior edges of the ARC layer exposed to the ambient atmosphere during the subsequent assembly operations of the integrated circuit device. The interior edges of the ARC layer corrode rapidly when exposed to the high temperatures and high humidity that are present during subsequent accelerated reliability testing procedures. In addition, corrosion can occur in the assembly process from the exposure to corrosive materials used in die packaging. The corrosion of the exposed interior edges of the ARC layer can extend for hundreds of microns through the ARC layer. Corrosion in the ARC layer leads to device failure by creating high electrical resistance and cracks in the overlying passivation layer.

To better illustrate the problem FIG. 1 shows a schematic diagram of a plan view of a prior art bond pad structure 100. The top layer shown in FIG. 1 is the anti-reflective coating layer 110 (ARC layer 110). FIG. 2 shows a schematic diagram 200 of a cross sectional view of the bond pad structure 110 taken along the line A-A in FIG. 1. As shown in FIG. 2, the top layer is ARC layer 110. The ARC layer 110 is typically formed of titanium (Ti), titanium nitride (TiN), tantalum nitride (TaN), titanium tungsten (TiW), or other metals.

The bottom layer shown in FIG. 2 is an oxide layer 210 that is located on a substrate (not shown). Metal stack 220 is located on oxide layer 210. Metal stack 220 may typically comprise metals such as aluminum (Al), copper (Cu), titanium (Ti), titanium nitride (TiN), and other metals. The ARC layer 110 is located on the metal stack 220. The thicknesses of the various layers of the prior art bond pad structure shown in FIG. 2 are not necessarily drawn to scale. For clarity the thicknesses of the various layers in FIG. 2 are shown larger than actual size.

The bond pad structure 100 is subsequently covered with a passivation layer 310. A mask and etch process is performed to etch a bond pad opening 320 through the passivation layer 310 and through the ARC layer 110 down to the metal stack 220. FIG. 3 shows a schematic diagram 300 of a plan view of the prior art bond pad structure 100 covered with passivation layer 310. The top layer shown in FIG. 3 is the passivation layer 310 that is located over the ARC layer 110. The metal stack 220 (not numbered in FIG. 3) is visible through the bond pad opening 320.

FIG. 4 shows a schematic diagram 400 of a cross sectional view of the bond pad structure shown in FIG. 3 taken along the line B-B in FIG. 3. As shown in FIG. 4, the etch process that creates bond pad opening 320 exposes the interior edges 410 of the ARC layer 110 to the ambient atmosphere. As previously described, the interior edges 410 of the ARC layer 110 are subject to corrosion during their exposure to high temperature, high humidity and corrosive materials during the subsequent assembly operations of the integrated circuit device.

The thicknesses of the various layers of prior art bond pad structure shown in FIG. 4 are not necessarily drawn to scale. For clarity the thicknesses of the various layers in FIG. 4 are shown larger than actual size.

FIG. 5 illustrates a flowchart 500 showing the steps of the prior art method and how the prior art method exposes the interior edges 410 of the ARC layer 110 to corrosion. First, an oxide layer 210 is deposited on a substrate (not shown) (step 510). Then a metal stack 220 is deposited on the oxide layer 210 (step 520). Then an anti-reflective coating layer 110 (ARC layer 110) is deposited on the metal layer 220 (step 530).

Then a passivation layer 310 is deposited on the ARC layer 110 (step 540). Then a mask and etch process is performed on the passivation layer 310 to etch the bond pad opening 320 through the passivation layer 310 and through the anti-reflective coating layer 110 (ARC layer 110) down to the metal stack 220. The mask and etch process exposes the interior edge portions 410 of the ARC layer 110 in the bond pad opening 320. The interior edge portions 410 of the ARC layer 110 become corroded due to exposure to the ambient atmosphere during the subsequent assembly operations of the integrated circuit device (step 560).

Therefore, there is a need in the art for a system and method that is capable of solving the above described corrosion problem that occurs in ARC layers of prior art bond pad structures.

The present invention provides a system and method that seals the interior edges of the ARC layer so that the interior edges of the ARC layer are not subject to corrosion. An ARC layer removal mask and etch step is inserted between a metal pad define step and a subsequent passivation deposition step. During the ARC layer removal mask and etch step a central portion of the ARC layer is removed from a central portion of the bond pad.

Normal processing is resumed after the ARC layer removal mask and etch step. A passivation deposition step is performed. Then a mask and etch process is performed to etch the bond pad opening through the passivation layer. A design rule of the present invention ensures that the interior edges of the etched passivation layer always overlap and cover the interior edges of the ARC layer.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 6 through 10, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged integrated circuit device.

Figure 1:
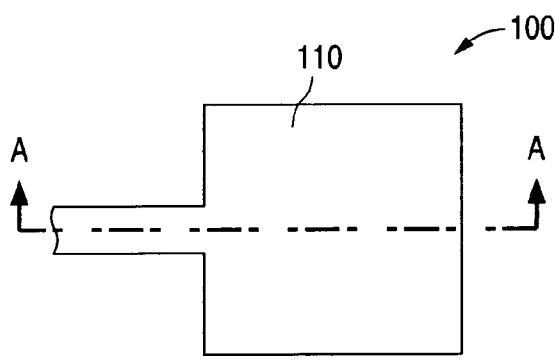
FIG. 1 illustrates a schematic diagram of a plan view of a prior art bond pad structure.
Figure 2:
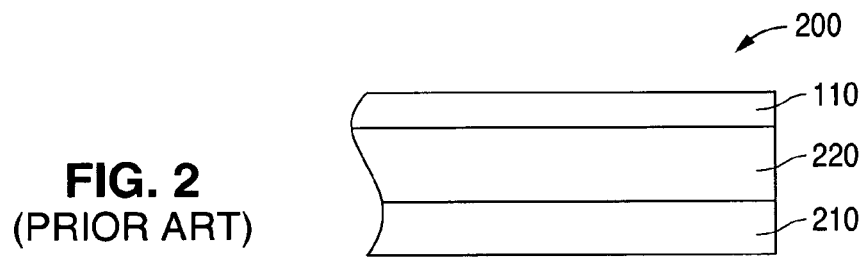
FIG. 2 illustrates a schematic diagram of a cross sectional view of the prior art bond pad structure shown in FIG. 1 taken along the line A-A.
Figure 3:
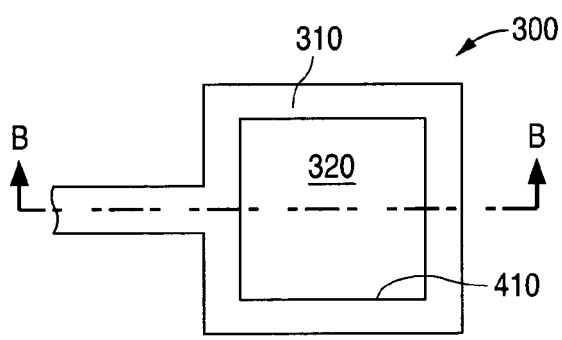
FIG. 3 illustrates a schematic diagram of a plan view of a prior art bond pad structure covered with a passivation layer.
Figure 4:
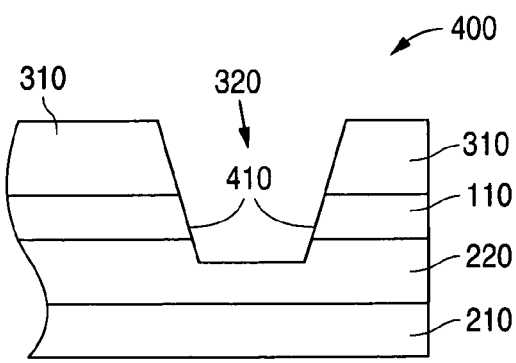
FIG. 4 illustrates a schematic diagram of a cross sectional view of the prior art bond pad structure shown in FIG. 3 taken along the line B-B.
Figure 5:
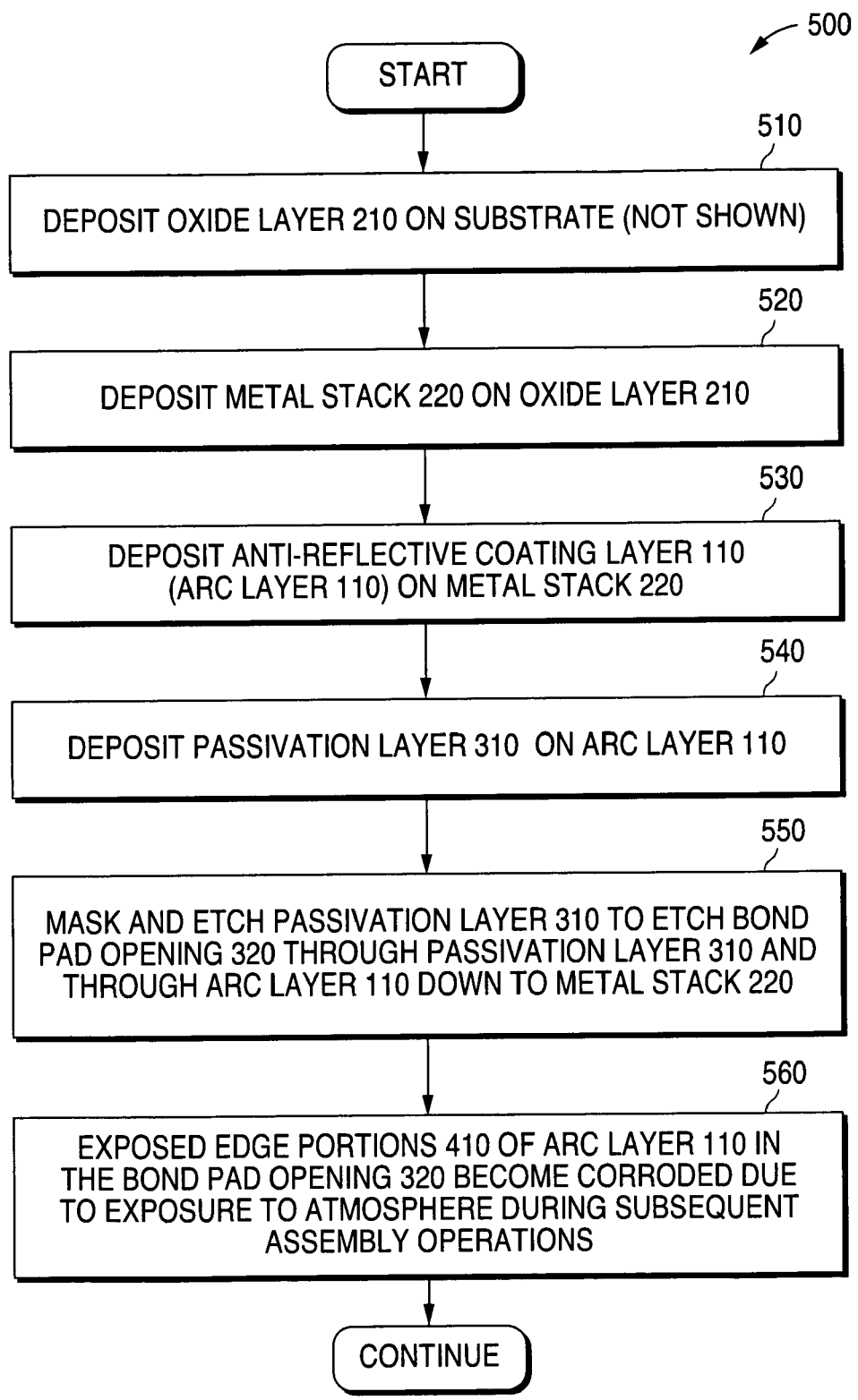
FIG. 5 illustrates a flowchart showing the steps of a prior art method and how the prior art method exposes the interior edges of an ARC layer to corrosion.
Figure 6:
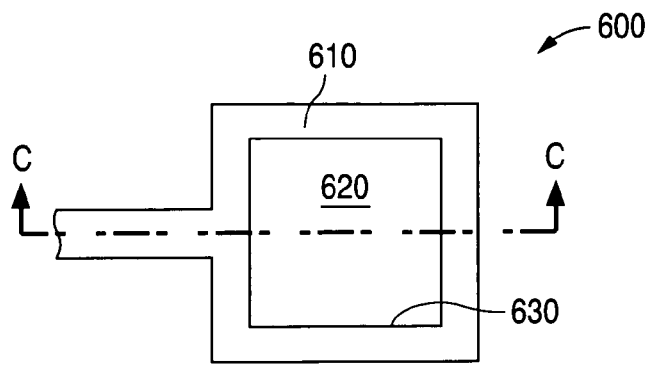
FIG. 6 illustrates a schematic diagram of a plan view of a bond pad structure of the present invention.

FIG. 6 illustrates a schematic diagram of a plan view of a bond pad structure 600 of the present invention. The top layer shown in FIG. 6 is an anti-reflective coating layer 610 (ARC layer 610). A mask and etch process has been performed to etch through the ARC layer 610 down to the underlying metal stack 220. A central portion of the ARC layer 610 has been removed by the mask and etch process to form an ARC layer aperture 620 through the ARC layer 610. The interior edges of the ARC layer aperture 620 are designated with the reference numeral 630. The metal stack 220 (not numbered in FIG. 6) is visible through the ARC layer aperture 620.

Figure 7:
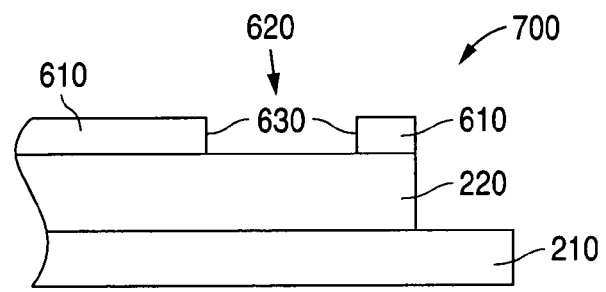
FIG. 7 illustrates a schematic diagram of a cross sectional view of the bond pad structure of the present invention shown in FIG. 6 taken along the line C-C.

FIG. 7 illustrates a schematic diagram of a cross sectional view of the bond pad structure 600 of the present invention shown in FIG. 6 taken along the line C-C. As shown in FIG. 7, the top layer comprises ARC layer 610 having the ARC layer aperture 620 etched through the central portion of ARC layer 610. The ARC layer 610 is typically formed of titanium (Ti), titanium nitride (TiN), tantalum nitride (TaN), titanium tungsten (TiW), or other metals.

The bottom layer shown in FIG. 7 is an oxide layer 210 that is located on a substrate (not shown). Metal stack 220 is located on oxide layer 210. Metal stack 220 may typically comprise metals such as aluminum (Al), copper (Cu), titanium (Ti), titanium nitride (TiN), and other metals. The ARC layer 610 is located on the metal stack 220. The thicknesses of the various layers of bond pad structure of the present invention shown in FIG. 7 are not necessarily drawn to scale. For clarity the thicknesses of the various layers in FIG. 7 are shown larger than actual size.

The bond pad structure 600 is subsequently covered with a passivation layer 810. A mask and etch process is performed to etch a bond pad opening 820 through the passivation layer 810 down to the metal stack 220. The mask and etch process that etches through the passivation layer 810 to the metal stack 220 does not touch the ARC layer 610. By a design rule of the present invention the mask and etch process that etches through the passivation layer 810 to form bond pad opening 820 leaves portions of the passivation layer 810 over the interior edges 630 of the ARC layer 610 to seal the interior edges 630 from the ambient atmosphere.

Figure 8:
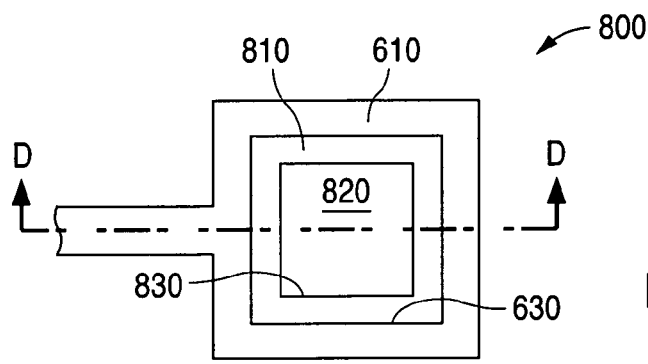
FIG. 8 illustrates a schematic diagram of a plan view of the bond pad structure of the present invention covered with a passivation layer.

FIG. 8 shows a schematic diagram 800 of a plan view of the bond pad structure 600 of the present invention covered with passivation layer 810. The top layer shown in FIG. 8 is the passivation layer 810 that is located over the ARC layer 610. The interior edges of the passivation layer 810 are designated with reference numeral 830. The extent of the bond pad opening 820 is shown in the central portion of the bond pad structure. The metal stack 220 (not numbered in FIG. 8) is visible through the bond pad opening 820.

Figure 9:
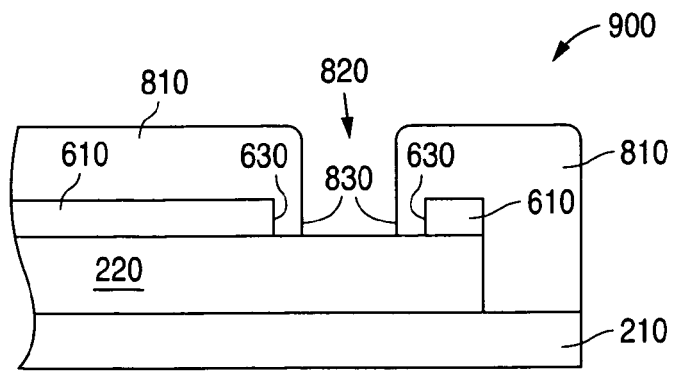
FIG. 9 illustrates a schematic diagram of a cross sectional view of the bond pad structure of the present invention shown in FIG. 8 taken along the line D-D.

FIG. 9 illustrates a schematic diagram 900 of a cross sectional view of the bond pad structure of the present invention shown in FIG. 8 taken along the line D-D. As shown in FIG. 9, the etch process that creates the bond pad opening 820 covers (and does not expose) the interior edges 630 of the ARC layer 610. Therefore, the interior edges 630 of the ARC layer 610 are not exposed to the high temperature and high humidity of the subsequent assembly operations of the integrated circuit device. This prevents corrosion from occurring in the ARC layer 610.

Figure 10:
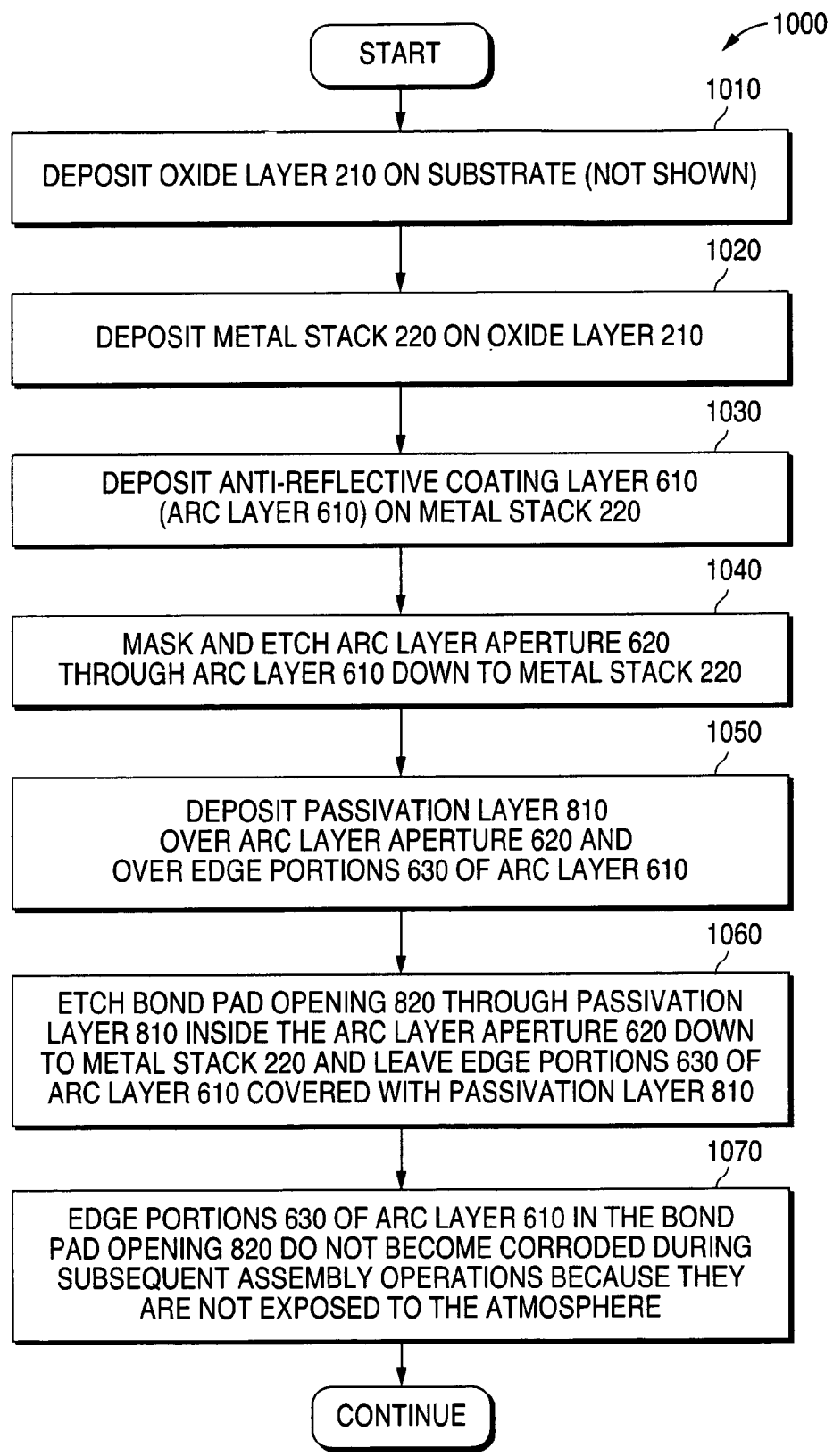
FIG. 10 illustrates a flowchart showing the steps of an advantageous embodiment of a method of the present invention and how the method of the present invention prevents corrosion of the interior edges of the ARC layer in the bond pad structure of the present invention.

FIG. 10 illustrates a flowchart 1000 showing the steps of an advantageous embodiment of a method of the present invention and how the method of the present invention prevents corrosion of the interior edges 630 of the ARC layer 610 in the bond pad structure of the present invention. First, an oxide layer 210 is deposited on a substrate (not shown) (step 1010). Then a metal stack 220 is deposited on the oxide layer 210 (step 1020). Then an anti-reflective coating layer 610 (ARC layer 610) is deposited on the metal layer 220 (step 1030).

Then a mask and etch process is used to etch an ARC layer aperture 620 through the ARC layer 610 down to the metal stack 220 (step 1040). Then a passivation layer 810 is deposited over the ARC layer aperture 620 and over the interior edge portions 630 of ARC layer 610 (step 1050). Then a mask and etch process is performed on the passivation layer 810 to etch a bond pad opening 820 through the passivation layer 810 inside the ARC layer aperture 620 down to the metal stack 220. The mask and etch process leaves the edge portions 630 of the ARC layer 610 covered with portions of the passivation layer 810 (step 1060).

The interior edge portions 630 of the ARC layer 610 do not become corroded during the subsequent assembly operations of the integrated circuit device because the interior edge portions 630 are not exposed to the ambient atmosphere (step 1070). This prevents corrosion of the ARC layer 610 in the present invention.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for preventing metal corrosion on a bond pad of an integrated circuit device, the method comprising the steps of:
    applying an anti-reflective coating layer to a metal stack of the bond pad;
    etching a portion of the anti-reflective coating layer to form an anti-reflective coating layer aperture through the anti-reflective coating layer down to the metal stack, the anti-reflective coating layer aperture having an upper edge, a lower edge, and a sidewall surface extending between the upper edge and the lower edge, the sidewall surface formed during formation of the anti-reflective coating layer aperture;
    depositing a passivation layer over the anti-reflective coating layer to seal the sidewall surface of the anti-reflective coating layer aperture from an ambient atmosphere; and
    etching an opening through the passivation layer down to the metal stack, wherein the etching leaves portions of the passivation layer that cover (i) the sidewall surface of the anti-reflective coating layer aperture, (ii) a top surface of the anti-reflective coating layer, and (iii) outer sidewall surfaces of the anti-reflective coating layer and the metal stack.

2. The method as set forth in claim 1, further comprising:
    forming a circuit connector through the opening in the passivation layer, through the anti-reflective coating layer aperture, and between the portions of the passivation layer covering the sidewall surface of the anti-reflective coating layer aperture, the circuit connector providing electrical connection between the metal stack and the integrated circuit device.

3. The method as set forth in claim 1, wherein the etching comprises:
    performing a mask and etch process to etch a bond pad opening through the passivation layer down to the metal stack.

4. The method as set forth in claim 1, wherein the metal stack comprises at least one of: aluminum, copper, titanium, and titanium nitride.

5. The method as set forth in claim 1, wherein the passivation layer protects the sidewall surface of the anti-reflective coating layer aperture from at least one of: a high temperature and a high humidity of the ambient atmosphere associated with subsequent assembly operations of the integrated circuit device.

6. The method as set forth in claim 1, wherein the passivation layer protects the sidewall surface of the anti-reflective coating layer aperture from corrosive materials used in subsequent assembly operations of the integrated circuit device.

7. The method as set forth in claim 1, wherein the passivation layer prevents corrosion of the anti-reflecting coating layer.

8. A method for preventing metal corrosion on a bond pad of an integrated circuit device, the method comprising the steps of:
    applying an anti-reflective coating layer to a top layer of a metal stack of the bond pad;
    performing a mask and etch process to remove a portion of the anti-reflective coating layer to create an anti-reflective coating layer aperture through the anti-reflective coating layer down to the metal stack, the anti-reflective coating layer aperture having an upper edge, a lower edge, and a sidewall surface extending between the upper edge and the lower edge, the sidewall surface formed during formation of the anti-reflective coating layer aperture;
    depositing a passivation layer over the anti-reflective coating layer to seal the sidewall surface of the anti-reflective coating layer aperture from an ambient atmosphere; and
    etching an opening through the passivation layer down to the metal stack, wherein the etching leaves portions of the passivation layer that cover (i) the sidewall surface of the anti-reflective coating layer aperture, (ii) a top surface of the anti-reflective coating layer, and (iii) outer sidewall surfaces of the anti-reflective coating layer and the metal stack.

9. The method as set forth in claim 8, further comprising:
    forming a circuit connector through the opening in the passivation layer, through the anti-reflective coating layer aperture, and between the portions of the passivation layer covering the sidewall surface of the anti-reflective coating layer aperture, the circuit connector providing electrical connection between the metal stack and the integrated circuit device.

10. The method as set forth in claim 8, wherein the passivation layer prevents corrosion of the anti-reflecting coating layer.

11. The method as set forth in claim 8, wherein the etching comprises:
    performing a second mask and etch process to etch a bond pad opening through the passivation layer down to the metal stack.

12. The method as set forth in claim 8, wherein the metal stack comprises at least one of: aluminum, copper, titanium, and titanium nitride.

13. The method as set forth in claim 8, wherein the passivation layer protects the sidewall surface of the anti-reflective coating layer aperture from at least one of: a high temperature and a high humidity of the ambient atmosphere associated with subsequent assembly operations of the integrated circuit device.

14. The method as set forth in claim 8, wherein the passivation layer protects the sidewall surface of the anti-reflective coating layer aperture from corrosive materials used in subsequent assembly operations of the integrated circuit device.

15. A method for preventing metal corrosion on a bond pad of an integrated circuit device, the method comprising the steps of:
    forming an anti-reflective coating layer over a metal stack of the bond pad, the anti-reflective coating layer having an anti-reflective coating layer aperture through the anti-reflective coating layer down to the metal stack, the anti-reflective coating layer aperture having an upper edge, a lower edge, and a sidewall surface extending between the upper edge and the lower edge;

depositing a passivation layer over the anti-reflective coating layer to seal the sidewall surface of the anti-reflective coating layer aperture from an ambient atmosphere; and etching an opening through the passivation layer down to the metal stack, wherein the etching leaves portions of the passivation layer that cover (i) the sidewall surface of the anti-reflective coating layer aperture, (ii) a top surface of the anti-reflective coating layer, and (iii) outer sidewall surfaces of the anti-reflective coating layer and the metal stack.

16. The method as set forth in claim 15, further comprising:

forming a circuit connector through the opening in the passivation layer, through the anti-reflective coating layer aperture, and between the portions of the passivation layer covering the sidewall surface of the anti-reflective coating layer aperture, the circuit connector providing electrical connection between the metal stack and the integrated circuit device.

17. The method as set forth in claim 15, wherein the passivation layer prevents corrosion of the anti-reflecting coating layer.

18. The method as set forth in claim 15, wherein the etching comprises:

performing a mask and etch process to etch a bond pad opening through the passivation layer down to the metal stack.

19. The method as set forth in claim 15, wherein the metal stack comprises at least one of: aluminum, copper, titanium, and titanium nitride.

20. The method as set forth in claim 15, wherein the passivation layer protects the sidewall surface of the anti-reflective coating layer aperture from at least one of: a high temperature and a high humidity of the ambient atmosphere associated with subsequent assembly operations of the integrated circuit device.

* * * * *